(12) United States Patent
Partovi et al.

(10) Patent No.: US 7,480,358 B2
(45) Date of Patent: Jan. 20, 2009

(54) CDR-BASED CLOCK SYNTHESIS

(75) Inventors: Hamid Partovi, Sunnyvale, CA (US); William P. Evans, Catonsville, MD (US)

(73) Assignee: Infineon Technologies AG, Munich (DE)

( * ) Notice: Subject to any disclaimer, the term of this patent is extended or adjusted under 35 U.S.C. 154(b) by 679 days.

(21) Appl. No.: 10/786,879

(22) Filed: Feb. 25, 2004

(65) Prior Publication Data
US 2005/0193301 A1   Sep. 1, 2005

(51) Int. Cl.
*H04L 7/00* (2006.01)
(52) U.S. Cl. ........................................ 375/354
(58) Field of Classification Search ............... 375/354, 375/355, 358, 376, 219; 714/700, 733
See application file for complete search history.

(56) References Cited

U.S. PATENT DOCUMENTS

| | | | |
|---|---|---|---|
| 5,512,860 A | 4/1996 | Huscroft et al. | |
| 5,835,501 A | 11/1998 | Dalmia et al. | |
| 6,243,369 B1 | 6/2001 | Grimwood et al. | |
| 6,353,604 B2 | 3/2002 | Grimwood et al. | |
| 6,566,967 B1 | 5/2003 | Anumula et al. | |
| 6,614,318 B1 | 9/2003 | Boecker | |
| 6,714,613 B2 | 3/2004 | Schenk | |
| 6,721,377 B1 | 4/2004 | Jenkner et al. | |
| 6,754,613 B2 | 6/2004 | Tabatabaei et al. | |
| 2002/0075845 A1 | 6/2002 | Mullaney et al. | |
| 2003/0212930 A1* | 11/2003 | Aung et al. | 714/700 |
| 2004/0028156 A1 | 2/2004 | Sefidvash et al. | |
| 2004/0243899 A1* | 12/2004 | Bonneau et al. | 714/733 |
| 2005/0052189 A1* | 3/2005 | Christensen | 324/622 |

FOREIGN PATENT DOCUMENTS

WO   WO 99/22482   5/1999

* cited by examiner

*Primary Examiner*—Khai Tran
(74) *Attorney, Agent, or Firm*—Dicke, Billig & Czaja, PLLC

(57) ABSTRACT

A clock signal can be synthesized by performing a clock and data recovery (CDR) operation on a potentially noisy clock source signal which has a known transition density. The CDR operation produces a desired clock signal in response to the clock source signal. In order to reduce crosstalk between plesiochronous receive and transmit clock domains of a serial data transceiver, a single common PLL is used both to recover the receive clock from the received data and to synthesize the transmit clock from a potentially noisy transmit clock source signal.

28 Claims, 1 Drawing Sheet

CDR-BASED CLOCK SYNTHESIS

FIELD OF THE INVENTION

The invention relates generally to clock synthesis and, more particularly, to CDR (clock and data recovery)-based clock synthesis.

BACKGROUND OF THE INVENTION

Conventional serial data transceivers are operable for transmitting and receiving serial data on a communication medium. Serial data transmission is controlled by a transmit clock signal. The transceiver device receives as an input a potentially noisy external clock source, and produces the transmit clock signal in response to this external clock source. The noisy external clock source is typically cleaned up by applying thereto a narrow-band filtering operation. Conventional approaches implement the narrow-band filtering with an analog implementation, which requires large capacitors. Thus, such analog implementations either occupy a large amount of die area within the transceiver, or must be implemented externally of the transceiver, thereby necessitating additional components and associated costs.

Generation of the transmit clock signal is also affected by a phenomenon known as frequency pulling. Frequency pulling exhibits itself as a low frequency modulation of the phase-locked loop (PLL) clocks and the transmit clock signal by the nearby receive clock signal that has been recovered from the incoming serial data, which receive clock signal has a frequency very close to the frequencies of the PLL clocks and the transmit clock signal. The modulation frequency can be determined by the ppm offset of the respective clocks. The modulation amplitude depends on how and to what degree the two frequencies are coupled, e.g., through substrate and power supply. The problem of frequency pulling becomes more pronounced at higher levels of integration. In order to minimize coupling and crosstalk, some conventional approaches provide the receiver and transmitter as separate integrated circuits.

It is desirable in view of the foregoing to provide a serial data transceiver that can reduce frequency pulling and/or perform the aforementioned narrow-band filtering of an external clock source, while also maintaining acceptable levels of integration and cost.

Clock and Data Recovery (CDR) loops are used by conventional serial data transceivers to recover a clock from a received serial data stream and, subsequently, to recover and deserialize the received serial data. An example of such a conventional CDR loop, designated as CDR1, is illustrated diagrammatically in FIG. 1. A reference clock signal REF_CLK is input to a PLL 11, which in turn generates quadrature I and Q clocks with a frequency to within parts per million (ppm) of the data rate of the serial data RXD_i received at input 13. The I and Q clocks are then duty cycle-corrected (DCC) and phase interpolated (PI). The phase interpolated signal ICLK at 14 is interpolated to be coincident to the data transitions, and the phase interpolated signal QCLK at 16 is interpolated to be centered in the middle of the data eye.

A bang-bang phase detector (PD) uses the clock signals ICLK and QCLK to provide at 15 phase error information which can be interpreted in the digital domain. Therefore, the succeeding stages in the CDR loop, for example the decimator 17, the loop filter (LPF) and the phase interpolator PI, can be implemented with digital or mixed-signal techniques. The loop CDR1 outputs parallel data RD_i and the corresponding recovered clock.

SUMMARY OF THE INVENTION

A clock signal is synthesized by performing a CDR operation on a potentially noisy clock source signal which has a fixed transition density. The CDR operation produces a desired clock signal in response to the clock source signal. A single common PLL is used for both clock recovery and clock synthesis.

DETAILED DESCRIPTION

A clock source can be thought of as a periodic data stream. Given a data rate of $f_D$, a clock source with a frequency of $f_D/(2 \times n)$ can be thought of as a periodic data stream with a $(100/n)$ percent transition density. For example, clocks at frequencies of 1.25 GHz (n=1), 625 MHz (n=2), and 417 MHz (n=3) are all 2.5 Gb/s periodic data streams with respective transition densities of 100%, 50% and 33%.

Performing CDR on a clock input is equivalent to recovering its frequency while attenuating its noise content. Unlike random data, a clock has a fixed (i.e., generally constant over time) transition density, so the CDR circuit can use a lower bandwidth than would be required for random data, thereby permitting rejection of phase noise at lower frequencies.

Figure 1:
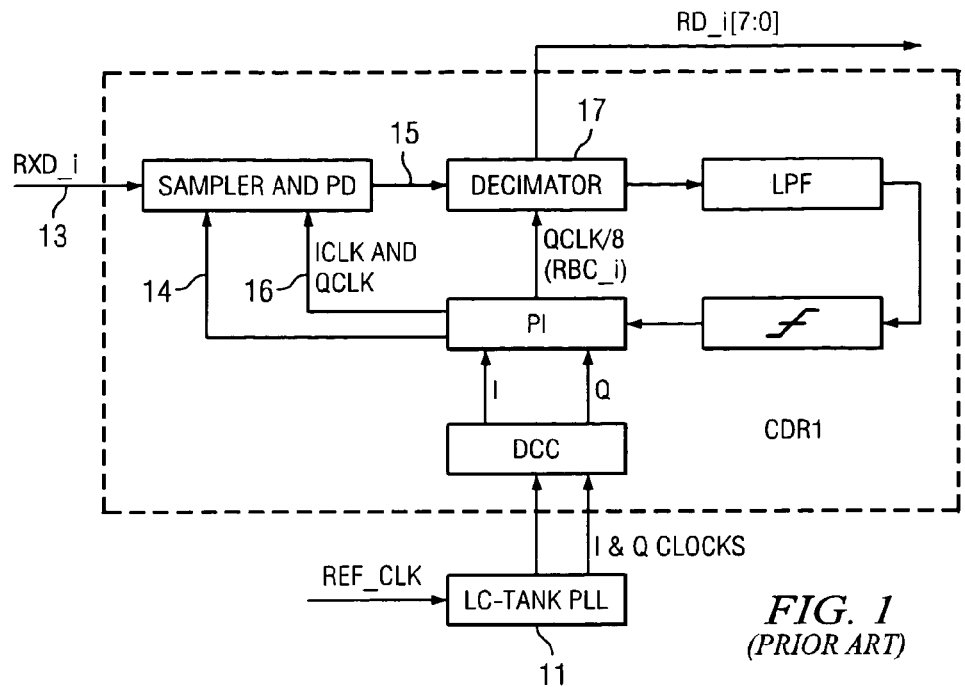
FIG. 1 diagrammatically illustrates a conventional example of a clock and data recovery circuit used at a serial data input of a conventional serial data transceiver.
Figure 2:
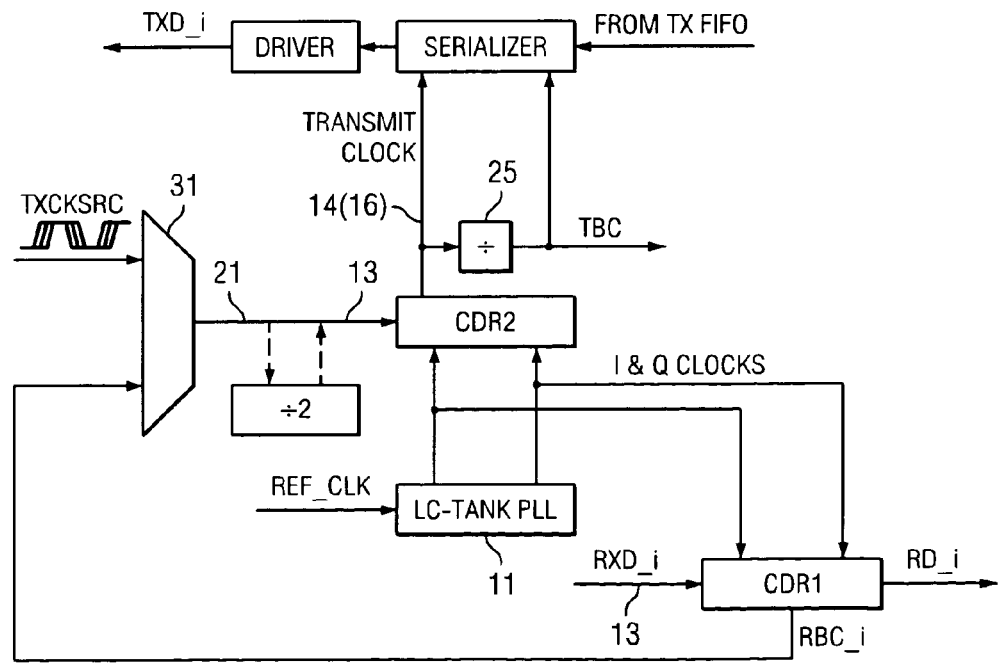
FIG. 2 diagrammatically illustrates pertinent portions of exemplary embodiments of a serial data transceiver apparatus according to the invention.

FIG. 2 diagrammatically illustrates pertinent portions of exemplary embodiments of a serial data transceiver according to the invention. A noisy external clock source (TXCKSRC) can be applied (e.g., via selector 31) to an input 21 of the transceiver. The input 21 is coupled to the serial data input 13 of a CDR loop CDR2. In some embodiments, CDR2 can have the same structure and functionality as the loop CDR1 (see also FIG. 1), although CDR2 can typically have a lower bandwidth than CDR1 because the input signal TXCKSRC has a known transition density, whereas CDR1 receives essentially random data RXD_i. The I and Q clock inputs of receive side loop CDR1 and transmit side loop CDR2 are produced by PLL 11 which is shared by both loops CDR1 and CDR2 and is driven by the reference clock signal REF_CLK (see also FIG. 1).

The transmit side loop CDR2 up-converts the incoming clock TXCKSRC to the serialization rate of the transmitted data, and also filters out noise content above the loop bandwidth, thereby minimizing jitter transfer. The transmit side loop CDR2 can thus generate cleaned-up clock signals, which can in turn be used in the transmit serialization process.

In some embodiments, the transmit clock signal produced by CDR2 in FIG. 2 can be taken from the same phase interpolator output that produces ICLK in CDR1 (see also FIG. 1), namely output 14 of CDR2 as shown in FIG. 2. Other embodiments use phase interpolator output 16 (which produces QCLK in FIG. 1) as the transmit clock signal. The transmit clock signal is used to serialize the data received from the transmit (TX) FIFO, resulting in output serial data TXD_i. If, for example, the clock source TXCKSRC has any of the three different frequencies specifically enumerated above (1.25 GHz, 625 MHz or 417 MHz), the transmit side loop CDR2 will produce the same transmit clock signal for any of the three input frequencies of TXCKSRC. Thus, the transmit serialization clock can be synthesized by performing a CDR operation on any one of a plurality of different frequency reference sources without requiring any frequency dividers. In some embodiments, the transmit clock frequency is equal to (serial transmit data rate)/2, so both the rising and falling edges of the transmit clock signal are used in the transmit serialization operation. The transmit clock signal is divided at 25 to produce a transmit byte clock signal TBC at a frequency equal to (serial transmit data rate)/8. TBC serves as the clock source for the transmit parallel data stream which is to be serialized to 8 times the parallel data rate. Also some embodiments may require quarter or ½ data rate clocks for 4:1 and 2:1 serialization ratios.

Although the received data stream RXD_i and the transmit clock source TXCKSRC are, in general, plesiochronous (i.e., they have a frequency offset), the recovered receive clock RBC_i and the narrow-banded transmit clock at output 14 (or 16) of CDR2 are both generated by continuous phase interpolation of the synthesized clocks I and Q from the shared PLL 11. In this manner, the PLL clocks I and Q, the receive clock RBC_i, and the transmit clock have the same instantaneous frequency. The frequencies do, however, deviate relative to one another over longer observation periods.

The phase noise of the I and Q clocks from the PLL 11 is high-pass filtered (i.e., the low frequency noise content of the I and Q clocks is attenuated) by the loops CDR1 and CDR2, which leads to the attenuation of low-frequency phase modulations due to, for example, frequency pulling and flicker noise present at the outputs of PLL 11.

It will be apparent to workers in the art that inventive techniques described herein are applicable in transceivers for use with a variety of conventional data communication standards, for example: the SFI-5 standard promulgated by the Optical Internetworking Forum (OIF); the Xaui standard promulgated by the IEEE 802.3ae 10 Gigabit Ethernet Task Force; the FiberChannel standard promulgated by the X3T9.3 Task Group of ANSI; and the SONET standard promulgated by the Exchange Carriers Standards Association for ANSI.

In one example, the jitter bandwidth of the noisy clock source TXCKSRC (or the received serial data stream) is in the range of 1.5 MHz to 1.25 GHz for a 2.5 Gb/s data rate. In order to attenuate the clock jitter, some exemplary embodiments program the loop bandwidth of CDR2 lower than 1.5 MHz. Furthermore, for example, a 40 ppm offset between the frequencies of the receive clock (RBC_i) and the I and Q clocks produced by the PLL causes a modulation frequency of 100 KHz. Accordingly, in some exemplary embodiments, in order to eliminate the jitter due to frequency pulling, the loop bandwidth of CDR2 is programmed appreciably higher than 100 KHz. In general, if the clock source TXCKSRC is relatively noisy, the loop bandwidth should be reduced, and if TXCKSRC is relatively clean, then the loop bandwidth can be widened to reduce pulling effects.

Continuing with the foregoing example, if the loop bandwidth of CDR2 is between 100 KHz and 1.5 MHz, the noisy external clock is cleaned up, and jitter induced by frequency pulling is mitigated. For some exemplary embodiments, reducing phase noise of the common PLL 11 in the 5 KHz to 100 KHz range is critical (for example in SONET embodiments). Accordingly, in such embodiments, the loop bandwidth of CDR2 can be tuned towards the upper end of the aforementioned range, for example approximately 1 MHz. In other embodiments, reducing the incoming clock jitter in the MHz range and higher is important (for example in SFI-5 embodiments, in FiberChannel embodiments and in Xaui embodiments), so the loop bandwidth of CDR2 can be tuned toward the lower end of the aforementioned range, for example approximately 150 KHz.

FIG. 2 also illustrates that, in some embodiments, either the external clock source TXCKSRC or the recovered receive clock signal RBC_i can be selectively applied to the input 21 by operation of a selector 31. The recovered clock is generally noisy and not suitable for data transmission without clean-up and filtering.

In some embodiments, as shown by broken line in FIG. 2, a divide-by-two circuit is provided between selector 31 and CDR2 to reduce the effects of duty cycle distortion at input 13 of CDR2.

It should be clear from the foregoing that exemplary embodiments of the present invention utilize CDR techniques to narrow-band filter a noisy external clock source (or a recovered clock) in order to recover its frequency and remove its phase noise content above the CDR bandwidth. The CDR loop also attenuates the low frequency noise content of the clocks produced by the PLL below the loop bandwidth of the CDR, thus removing random VCO phase noise and phase modulation due to frequency pulling.

According to exemplary transceiver embodiments of the invention described above, the noisy external clock source is applied to the serial data input of a first clock and data recovery circuit. The first clock and data recovery circuit narrow-band filters the noisy external clock source in the digital domain, and produces the transmit clock signal. The first clock and data recovery circuit is driven by the same PLL clocks that drive a second clock and data recovery circuit used on the receive side to recover the incoming serial data. Both clock and data recovery circuits high-pass filter the phase noise of their shared PLL clocks, which reduces frequency pulling.

In some embodiments, a single common PLL is used for both clock recovery and clock synthesis in order to reduce the jitter caused by pulling between the asynchronous receive and transmit channels. Besides providing narrow-band filtering to the input clock source, the CDR attenuates low-frequency phase modulations of the PLL outputs.

Although exemplary embodiments of the invention are described above in detail, this does not limit the scope of the invention, which can be practiced in a variety of embodiments.

What is claimed is:

1. A clock synthesizer apparatus, comprising:
  a clock and data recovery (CDR) circuit including a serial data input, said CDR circuit operable when a serial data stream is applied thereto via said serial data input for recovering a clock signal from the serial data stream;
  a clock source input for receiving a clock source signal having a fixed transition density, said clock source input coupled to said serial data input for applying said clock source signal to said CDR circuit; and
  said CDR circuit responsive to said clock source signal received at said serial data input thereof for producing a desired clock signal.

2. The apparatus of claim 1, wherein said CDR circuit has a loop bandwidth between 100 KHz and 1.5 MHz.

3. The apparatus of claim 1, wherein said CDR circuit has a loop bandwidth of approximately 1 MHz.

4. The apparatus of claim 1, wherein said CDR circuit has a programmable loop bandwidth.

5. The apparatus of claim 1, wherein said desired clock signal is a serialization clock signal for use in converting parallel data into a serial data stream.

6. The apparatus of claim 1, wherein said CDR circuit includes a first node where the recovered clock signal is provided when a serial data stream is applied to said serial data input, and said CDR circuit having a second node where said desired clock signal is provided when said clock source signal is applied to said serial data input, and wherein said first and second nodes are electrically distinct from one another.

7. The apparatus of claim 1, including a divide-by-two circuit connected between said clock source input and said serial data input.

8. A serial data transceiver apparatus, comprising:
a receive data input for receiving an input serial data stream;
a first clock and data recovery (CDR) circuit coupled to said receive data input for deserializing said input serial data stream;
a data serializer for converting parallel data into an output serial data stream, said data serializer having a clock input for receiving a transmit serialization clock signal, said data serializer for producing said output serial data stream based on said transmit serialization clock signal;
a clock synthesizer apparatus coupled to said clock input for providing said transmit serialization clock signal, including a second CDR circuit having a serial data input, said second CDR circuit operable when a serial data stream is applied thereto via said serial data input for recovering a clock signal from the serial data stream, said clock synthesizer apparatus including a clock source input for receiving a clock source signal, said clock source input coupled to said serial data input for applying said clock source signal to said second CDR circuit, said second CDR circuit responsive to said clock source signal for producing said transmit serialization clock signal; and
a transmit data output coupled to said data serializer for transmitting said output serial data stream.

9. The apparatus of claim 8, provided as a SONET transceiver.

10. The apparatus of claim 8, provided as an SFI-5 transceiver.

11. The apparatus of claim 8, provided as a FiberChannel transceiver.

12. The apparatus of claim 8, provided as a Xaui transceiver.

13. The apparatus of claim 8, including a selector having an output coupled to said serial data input, wherein said first CDR circuit is for recovering a clock signal from said input serial data stream, said selector having a first input coupled to said clock source input for receiving said clock source signal, and having a second input coupled to said first CDR circuit for receiving said recovered clock signal.

14. The apparatus of claim 13, wherein each of said CDR circuits has a PLL clock input for receiving first and second PLL clocks, and including a PLL having an output for providing said first and second PLL clocks, each of said CDR circuits having said PLL clock input thereof coupled to said PLL output for receiving said first and second PLL clocks.

15. The apparatus of claim 14, wherein each of said first and second CDR circuits attenuates low frequency phase noise components of said first and second PLL clocks.

16. The apparatus of claim 8, wherein said second CDR circuit has a loop bandwidth that is lower than a loop bandwidth of said first CDR circuit.

17. The apparatus of claim 8, wherein each of said CDR circuits has a PLL clock input for receiving first and second PLL clocks, and including a PLL having an output for providing said first and second PLL clocks, each of said CDR circuits having said PLL clock input thereof coupled to said PLL output for receiving said first and second PLL clocks.

18. The apparatus of claim 17, wherein each of said first and second CDR circuits attenuates low frequency phase noise components of said first and second PLL clocks.

19. The apparatus of claim 18, wherein said second CDR circuit rejects high frequency noise components said clock source signal.

20. The apparatus of claim 8, wherein said second CDR circuit low-pass filters said clock source signal.

21. The apparatus of claim 20, including a selector having an output coupled to said serial data input, wherein said first CDR circuit is for recovering a clock signal from said input serial data stream, said selector having a first input coupled to said clock source input for receiving said clock source signal, and having a second input coupled to said first CDR circuit for receiving said recovered clock signal.

22. A method of synthesizing a clock signal, comprising:
providing a clock source signal having a fixed transition density;
providing said clock source signal to a serial data input of a clock and data recovery (CDR) circuit; and
performing on said clock source signal received at said serial data input of said CDR circuit a CDR operation with said CDR circuit, which produces a desired clock signal in response to said clock source signal.

23. The method of claim 22, wherein the desired clock signal is a serialization clock signal for use in converting parallel data into a serial data stream.

24. The method of claim 22, wherein said performing step includes filtering said clock source signal in the digital domain.

25. A serial data transceiver apparatus, comprising:
means for deserializing an input serial data stream;
means for converting parallel data into an output serial data stream based on a transmit serialization clock signal; and
means for producing said transmit serialization clock signal by applying a clock and data recovery (CDR) operation with a CDR circuit to a clock source signal supplied to a serial data input of said CDR circuit.

26. A serial data transceiver apparatus, comprising:
a receive data input for receiving an input serial data stream;
a clock and data recovery (CDR) circuit coupled to said receive data input for recovering a receive clock signal form said input serial data stream;
a data serializer for converting parallel data into an output serial data stream, said data serializer having a clock input for receiving a transmit serialization clock signal, said data serializer for producing said output serial data stream based on said transmit serialization clock signal;
a clock synthesizer apparatus coupled to said clock input for providing said transmit serialization clock signal;
said CDR circuit and said clock synthesizer apparatus having respective PLL clock inputs, each said PLL clock input for receiving first and second PLL clocks; and
a PLL having an output for providing said first and second PLL clocks, said CDR circuit and said clock synthesizer apparatus each having said PLL clock input thereof coupled to said PLL output for receiving said first and second PLL clocks.

27. A serial data transceiver apparatus, comprising:

means for providing first and second PLL clocks;

means for recovering a received clock signal from an input serial data stream based on said first and second PLL clocks;

means for producing a transmit serialization clock signal based on said first and second PLL clocks; and means for converting parallel data into an output serial data stream based on said transmit serialization clock signal.

28. A method of transmitting and receiving serial data, comprising:

providing first and second PLL clocks;

recovering a receive clock signal from an input serial data stream based on said first and second PLL clocks;

producing a transmit serialization clock signal based on said first and second PLL clocks; and converting parallel data into an output serial data stream based on the transmit serialization clock signal.

* * * * *

UNITED STATES PATENT AND TRADEMARK OFFICE
CERTIFICATE OF CORRECTION

PATENT NO.         : 7,480,358 B2                                        Page 1 of 1
APPLICATION NO.  : 10/786879
DATED              : January 20, 2009
INVENTOR(S)        : Hamid Partovi and William P. Evans It is certified that error appears in the above-identified patent and that said Letters Patent is hereby corrected as shown below:

On the Title page Item (73) should read,

Assignee:  Infineon Technologies AG

Rambus Inc.

Signed and Sealed this

Sixth Day of October, 2009

David J. Kappos
*Director of the United States Patent and Trademark Office*